(12) United States Patent
Ikeda

(10) Patent No.: US 6,853,005 B2
(45) Date of Patent: Feb. 8, 2005

(54) CAMERA MODULE AND MANUFACTURING METHOD THEREOF

(75) Inventor: Osamu Ikeda, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/771,513

(22) Filed: Feb. 5, 2004

(65) Prior Publication Data
US 2004/0207036 A1 Oct. 21, 2004

(30) Foreign Application Priority Data
Jan. 27, 2003 (JP) .................................... 2003-017013

(51) Int. Cl.$^7$ .............................................. H01L 29/04
(52) U.S. Cl. .................... 257/72; 257/225; 257/226; 257/222; 438/48; 438/128; 438/149; 438/151
(58) Field of Search .......................... 257/72, 225, 226, 257/222; 438/48, 128, 149, 151

(56) References Cited

U.S. PATENT DOCUMENTS 6,066,090 A  *  5/2000  Yoon ........................... 600/113

* cited by examiner

Primary Examiner—Fetsum Abraham
(74) Attorney, Agent, or Firm—Morrison & Foerster LLP

(57) ABSTRACT

A camera module for a mobile device is reduced in size and manufacturing cost. A filter material made of a multi-layer thin film is bonded to a surface of a lens which is bonded to a surface of an image sensor chip. The filter material is a filter to block radiation within a predetermined range of wave length in an incident radiation to the lens, for example, an IR filter to block infrared radiation. An iris material made of a film such as an acrylic film or a polyolefin film is bonded to the lens covered with the filter material.

10 Claims, 10 Drawing Sheets

CAMERA MODULE AND MANUFACTURING METHOD THEREOF

BACKGROUND OF THE INVENTION

1. Field of the Invention

This invention relates to a camera module and its manufacturing method, specifically to a small size camera module suitable to be incorporated into a portable device such as a mobile phone and a manufacturing method of it.

2. Description of the Related Art

A mobile phone with camera function has come into widespread use in recent years. This type of mobile phone incorporates a small size camera module. FIG. 11 is a cross-sectional view showing a structure of such a camera module.

FIG. 11 shows a lens-barrel 50, a lens 51 mounted inside the lens-barrel 50 and an IR filter 52 to block infrared radiation attached to a mouth of the lens-barrel 50. It also shows an image sensor chip 60 housed in a space within the lens-barrel 50 and electrically connected with a printed circuit board 70.

The image sensor chip 60 converts light incident on it from a photogenic subject through the IR filter 52 and the lens 51 into electric signals. In the image sensor chip 60, CCDs (Charge Coupled Devices) are formed in a surface of a silicon chip 61 and a supporting glass substrate 62 is bonded to the silicon chip 61 to bolster it.

Each of redistribution wirings 64A and 64B is formed extending from each of electrode pads 63A and 63B, which are formed on a peripheral surface of the image sensor chip 60, over a side surface and to a back surface of the silicon chip 61.

Each of the redistribution wirings 64A and 64B extends onto a glass substrate 65 which is bonded to the back surface of the silicon chip 61. Each of bump electrodes 66A and 66B is formed on an end of each of the redistribution wirings 64A and 64B extended onto the glass substrate 65. The bump electrodes 66A and 66B are connected to the printed circuit board 70.

A DSP (Digital Signal Processor) 80, which performs video signal processing on the electric signals from the image sensor chip 60, is connected to a back surface of the printed circuit board 70 through bump electrodes 81A and 81B.

In the camera module described above, the lens-barrel 50, the lens 51, the IR filter 52 and the image sensor chip 60 are discrete components, and the camera module is assembled by putting these discrete components together. This causes difficulty in reducing the size and manufacturing cost of the camera module.

SUMMARY OF THE INVENTION

The invention provides a camera module that includes an image sensor chip having a photoelectronic transducer disposed in a top surface thereof and a terminal for external connection disposed on a back surface thereof, a lens supported on the top surface of the image sensor chip, and a filter formed on a surface of the lens and comprising a plurality of thin films.

The invention also provides a manufacturing method of a camera module. The method includes providing an image sensor wafer having a plurality of image sensor chips. Each of the image sensor chips includes a photoelectronic transducer disposed in a top surface thereof and a terminal for external connection disposed on a back surface thereof. The method also includes providing a lens array having a plurality of lenses, performing a deposition on a surface of the lens array so as to form a filter comprising a plurality of thin films, bonding the lens array and the image sensor wafer to form a bonded unit, and dividing the bonded unit into individual camera modules so that each of the camera modules includes one of the image sensor chips and one of the lenses.

DETAILED DESCRIPTION OF THE INVENTION

Next, an embodiment of this invention will be described in detail, referring to the figures.

Figure 1:
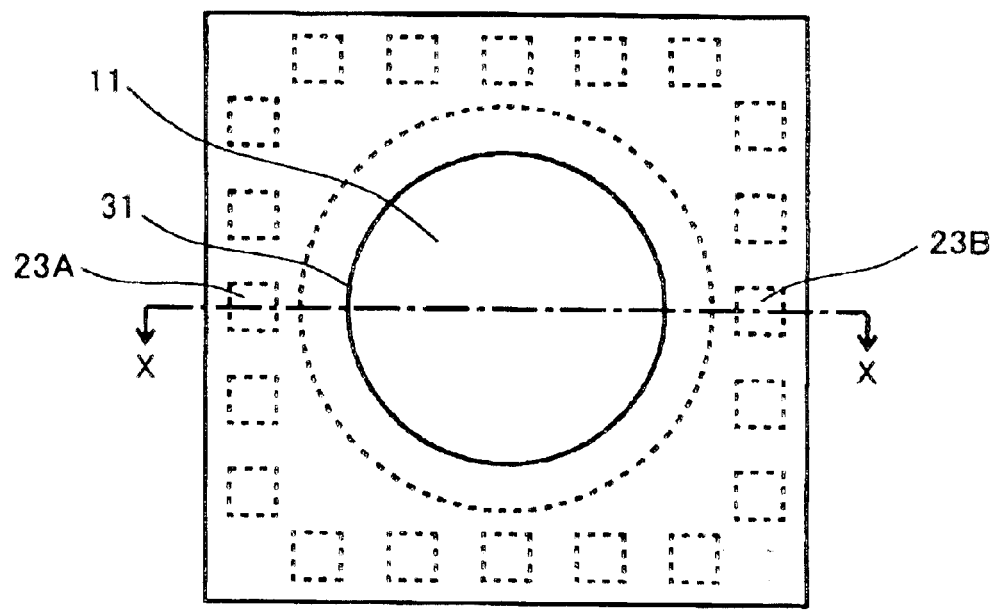
FIG. 1 is a plan view showing a camera module according to an embodiment of this invention.
Figure 2:
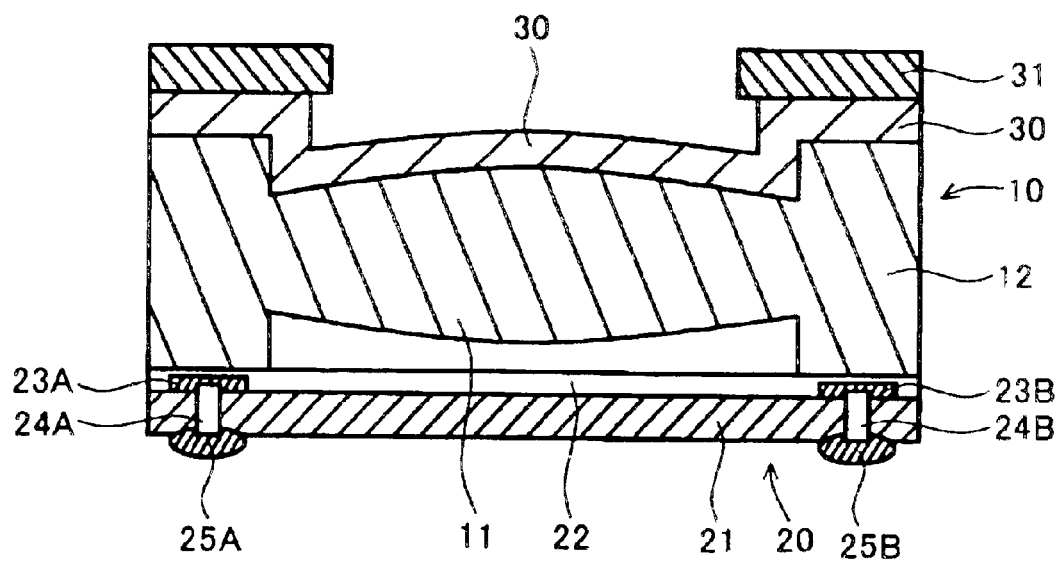
FIG. 2 is a cross-sectional view showing a section X—X in FIG. 1.

First, a structure of a camera module of the embodiment will be described. FIG. 1 is a plan view showing the camera module. FIG. 2 is a cross-sectional view showing a section X—X in FIG. 1.

Basic structure of the camera module includes an image sensor chip 20, a lens 10 bonded to a surface of the image sensor chip 20 and a filter material 30 made of a multi-layer thin film bonded to a surface of the lens 10. The filter material 30 is a filter to block radiation within a predetermined range of wave length in an incident radiation to the lens 10, for example, an IR filter to block infrared radiation. An iris material 31 made of a film such as an acrylic film or a polyolefin film is bonded to the lens 10 covered with the filter material 30.

The lens 10 is composed of a lens body 11 which is circular-shaped on the plan view and a lens frame 12 provided around the lens body 11 to bolster it and molded together with the lens body 11. The lens body 11 is formed to have a predetermined shape of curved surface in order to obtain desired optical characteristics. A height of the lens frame 12 is set to place a center of the lens body 11 at a predetermined distance from the surface of the image sensor chip 20, taking a focal length of the lens body 11 into consideration.

Although the filter material 30 needs to cover only the lens body 11, it is applied to both surfaces of the lens body 11 and the lens frame 12 for convenience of manufacturing. This is because a metal or the like is deposited over the entire surface of a lens array in the manufacturing process, as will be described later. The filter material 30 may be applied to the lens body 11 only. When heat induces metal expansion or contraction in the filter material 30, the distortion in the lens 10 can be made smaller in this structure than the structure in which the filter material 30 is applied to both the lens body 11 and the lens frame 12. In other words, the lens frame 11 can be utilized as a portion to relieve the expansion or contraction of the filter material 30.

Furthermore, the filter material 30 may be applied to the lower surface of the lens 10, i.e. a surface of the lens body 11 and/or the lens frame 12 facing to the bump electrodes, although a drawing showing this structure is omitted. In this case, a surface of the filter material 30 is not exposed outward in a process to mount the iris material 31 and in subsequent processes, eliminating possibility of damaging the surface of the filter material 30 to improve workability. The iris material 31 is bonded to the lens frame 12.

In the image sensor chip 20, CCDs, which are photoelectronic transducers, are formed in the surface of a silicon chip 21, and a supporting glass substrate 22 is bonded to the silicon chip 21 using an adhesive or the like to bolster the silicon chip 21 which is as thin as several hundred micrometers. Electrode pads 23A and 23B are formed on a peripheral surface of the silicon chip 21. Each of the electrode pads 23A and 23B is connected with an input/output circuit of the image sensor chip 20.

A bottom surface of each of the electrode pads 23A and 23B is connected with each of redistribution wirings 24A and 24B which penetrate through the silicon chip 21 to reach a back surface of the image sensor chip 20. Each of bump electrodes 25A and 25B, which serve as terminals for external connection, is formed on an exposed surface of each of the redistribution wirings 24A and 24B.

Figure 3:
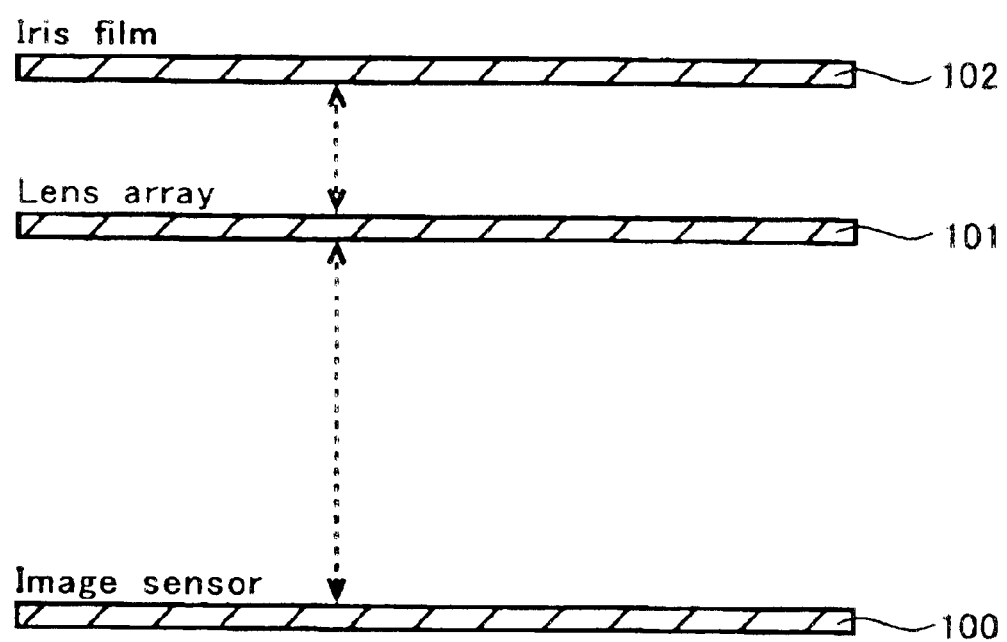
FIG. 3 is a cross-sectional view showing a manufacturing method of the camera module according the embodiments of this invention.

Next, a manufacturing method of the camera module described above will be explained. An image sensor wafer 100, in which a plurality of image sensor chips 20 formed by wafer processing is disposed in a matrix form, is provided as shown in FIG. 3. Also, a lens array 101, which is formed by integrating a plurality of lenses 10 each having the same shape and size as the image sensor chip 20, is provided.

Figure 4:
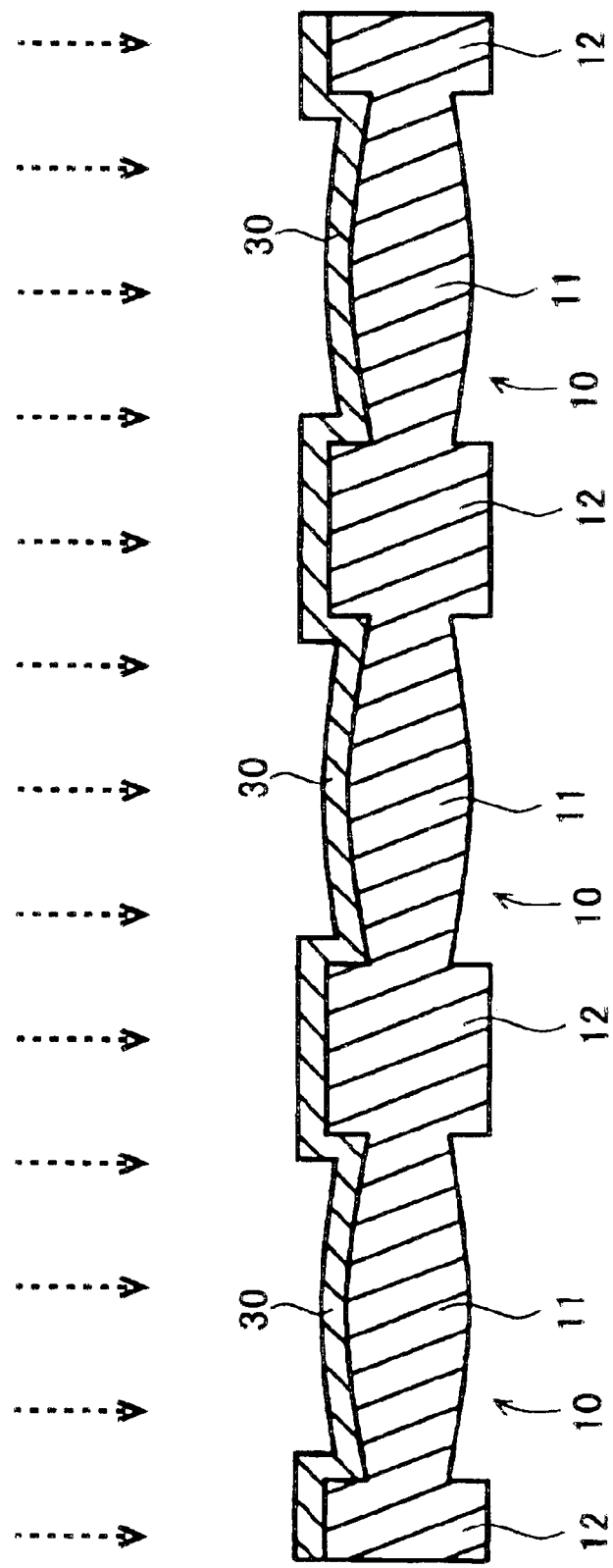
FIG. 4 is a cross-sectional view showing the manufacturing method of the camera module according the embodiments of this invention.

FIG. 4 is an enlarged view of a part of the lens array 101 shown in FIG. 3. In the lens array 101, the lens body 11 and the lens frame 12 are arranged in alternating sequence to form an integrated unit. And a filter material 30 made of a multi-layer thin film is vacuum deposited on the entire surface of the lens array 101. An iris film 103 having a shape of the wafer is also provided.

Figure 5A:
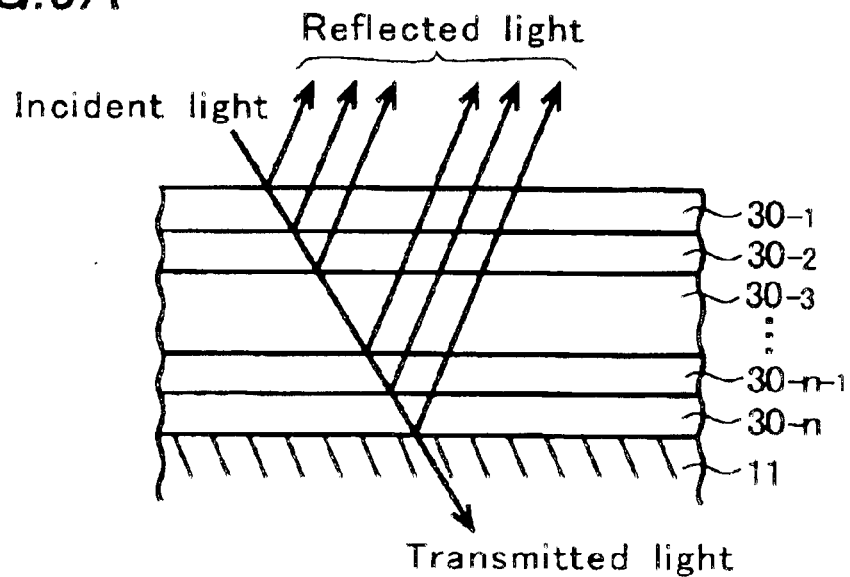
FIGS. 5A, 5B and 5C show characteristics of a filter material according to the embodiment of this invention.

The filter material 30 is made of n (natural number greater than or equal to two) layers of thin films 30-1, 30-2, . . . , 30-n, as shown in FIG. 5A. Light coming from a photogenic subject is reflected at an interface of one layer of the thin film at a rate predetermined by a refection coefficient. Transmitted light reaches an underlying layer of the thin film and is reflected at the interface of the underlying layer. The same step is repeated at each consecutive layer of the thin film. Constituent material and thickness of each layer of the thin film is chosen according to desired filter characteristics. The thickness is around 0.1 μm.

Figure 5B:
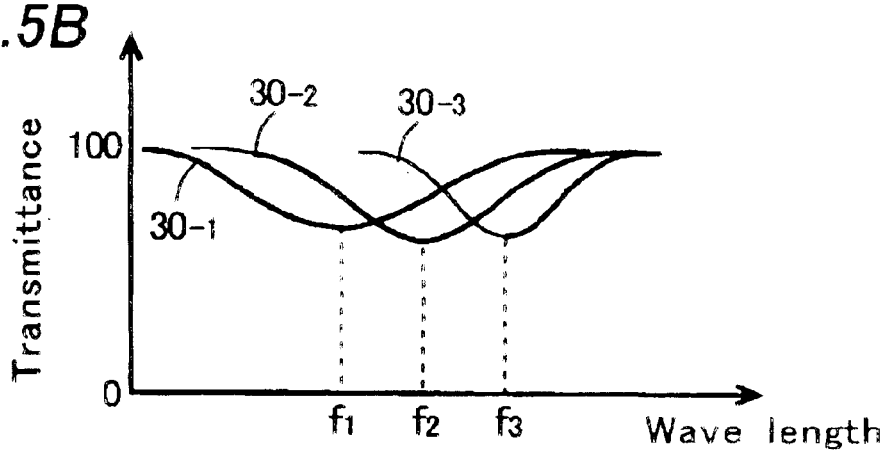

FIG. 5B is a conceptual diagram showing transmittance characteristics of each layer of the thin film. Transmittance of the layer 30-1 reaches a minimum value at a wave length of f1, for example. And transmittance of a layer 30-2 shows a minimum value at a wave length of f2. Also transmittance of the layer 30-3 reaches a minimum value at a wave length of f3. Transmittance of each layer of the thin film varies depending on the constituent material and thickness of the layer. Comprehensive transmittance of the filter material is represented by a product of transmittances of all layers of the thin film.

Figure 5C:
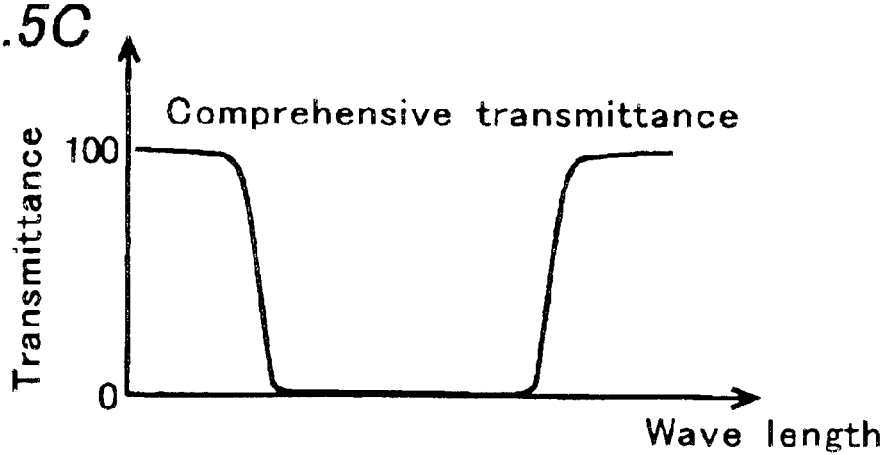

Filter characteristics which have near zero transmittance over a predetermined range of wavelength can be obtained as a result, as shown in FIG. 5C. Main constituent materials of the thin film include metals such as aluminum, platinum, gold, copper, chromium an nickel, semiconductors such as silicon or germanium, oxide such as tantalum (V) oxide, titanium dioxide, silicon monoxide, silicon dioxide, zirconium dioxide, indium oxide, chromium oxide, aluminum oxide and hafnium oxide or other materials such as zinc sulfide and magnesium fluoride.

Then the image sensor wafer 100, the lens array 101 described above and the iris film 102 are bonded together, forming an integrated structure.

Figure 6B:
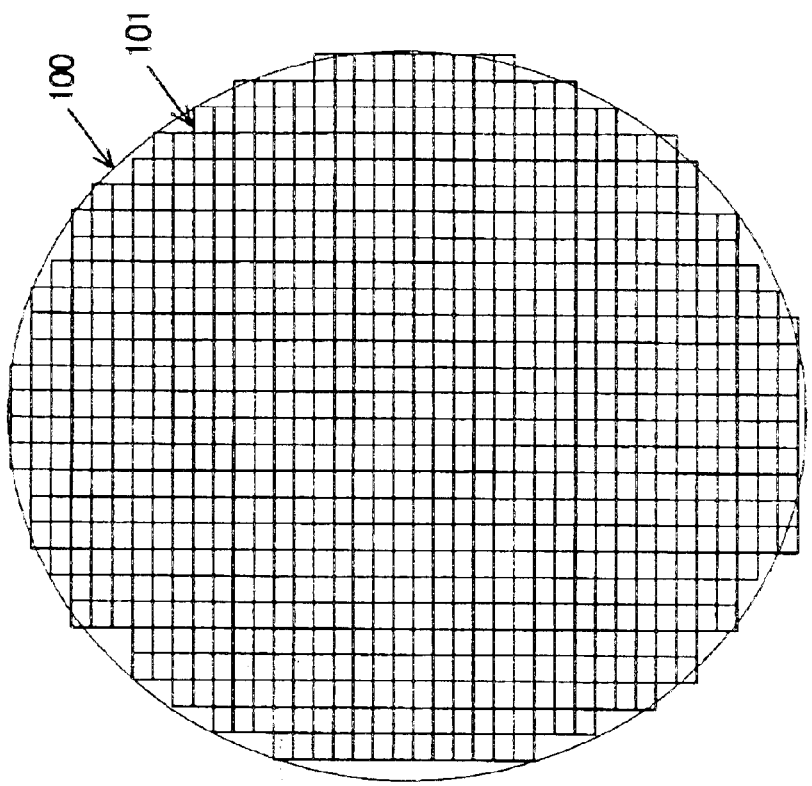
FIGS. 6A and 6B are plan views showing a first example of a lens array.
Figure 6A:
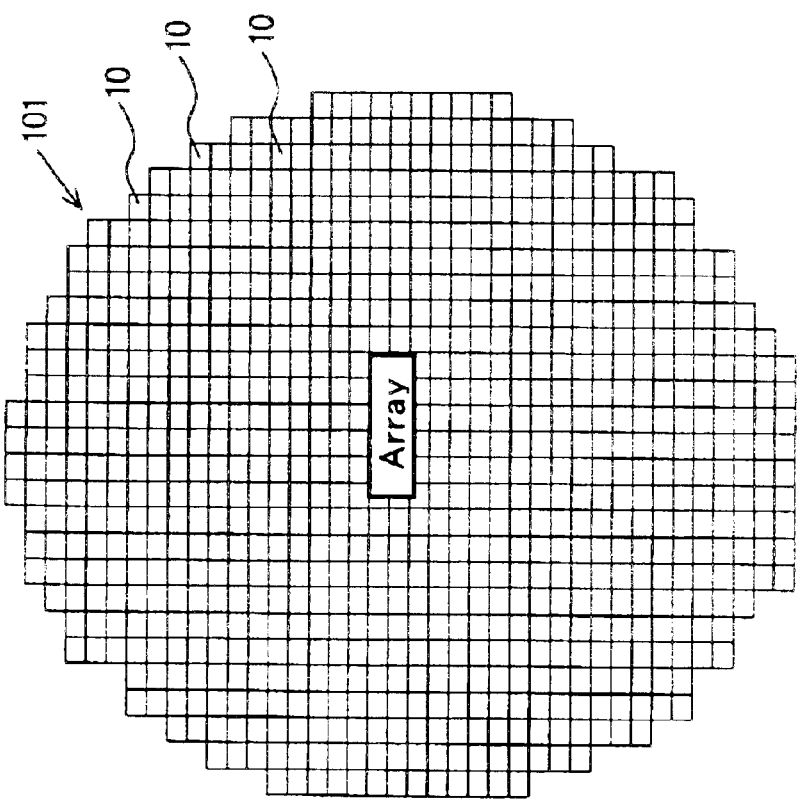

FIG. 6A is a plan view showing a first example of the lens array 101. The first example of the lens array 101 has a multitude of lenses 10 arranged to make an envelope of the array in a shape essentially the same as the wafer, as shown in FIG. 6A. And the lens array 101 is bonded onto the image sensor wafer 100, as shown in FIG. 6B.

Figure 7A:
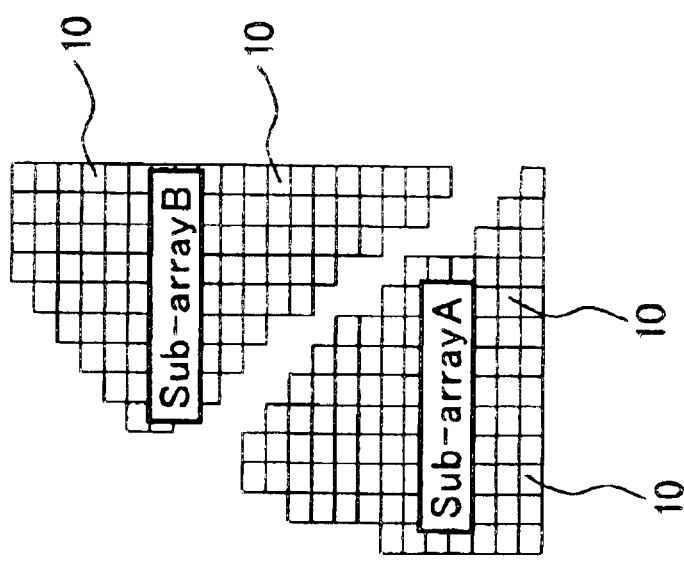
FIGS. 7A and 7B are plan views showing a second example of the lens array.
Figure 7B:
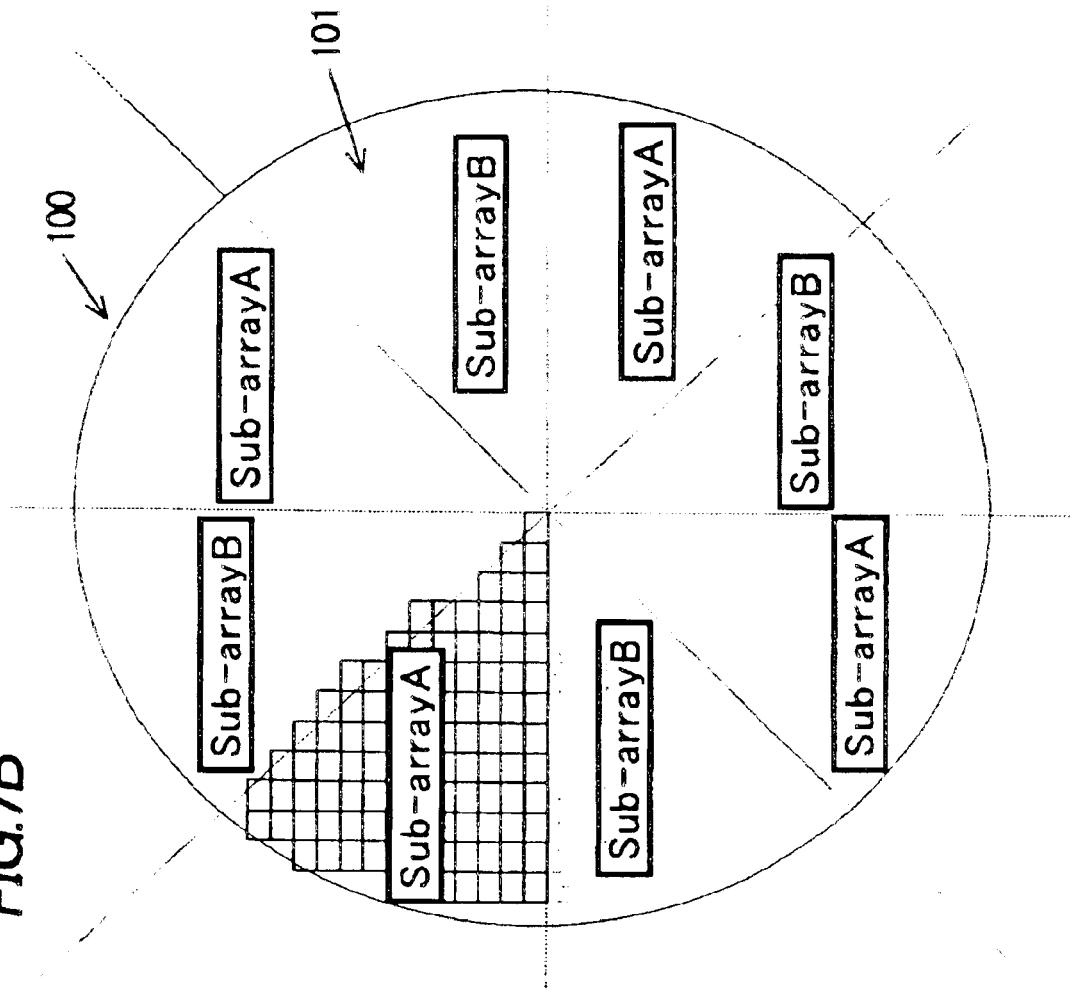

FIG. 7A is a plan view showing a second example of the lens array 101. The second example of the lens array 101 is composed of two kinds of sub-arrays, i.e., sub-arrays A and sub-arrays B, each of the sub-arrays being nearly triangular shaped, as shown in FIG. 7A. Four each of the sub-array A and the sub-array B are bonded to the image sensor wafer 100, as shown in FIG. 7B.

Figure 8B:
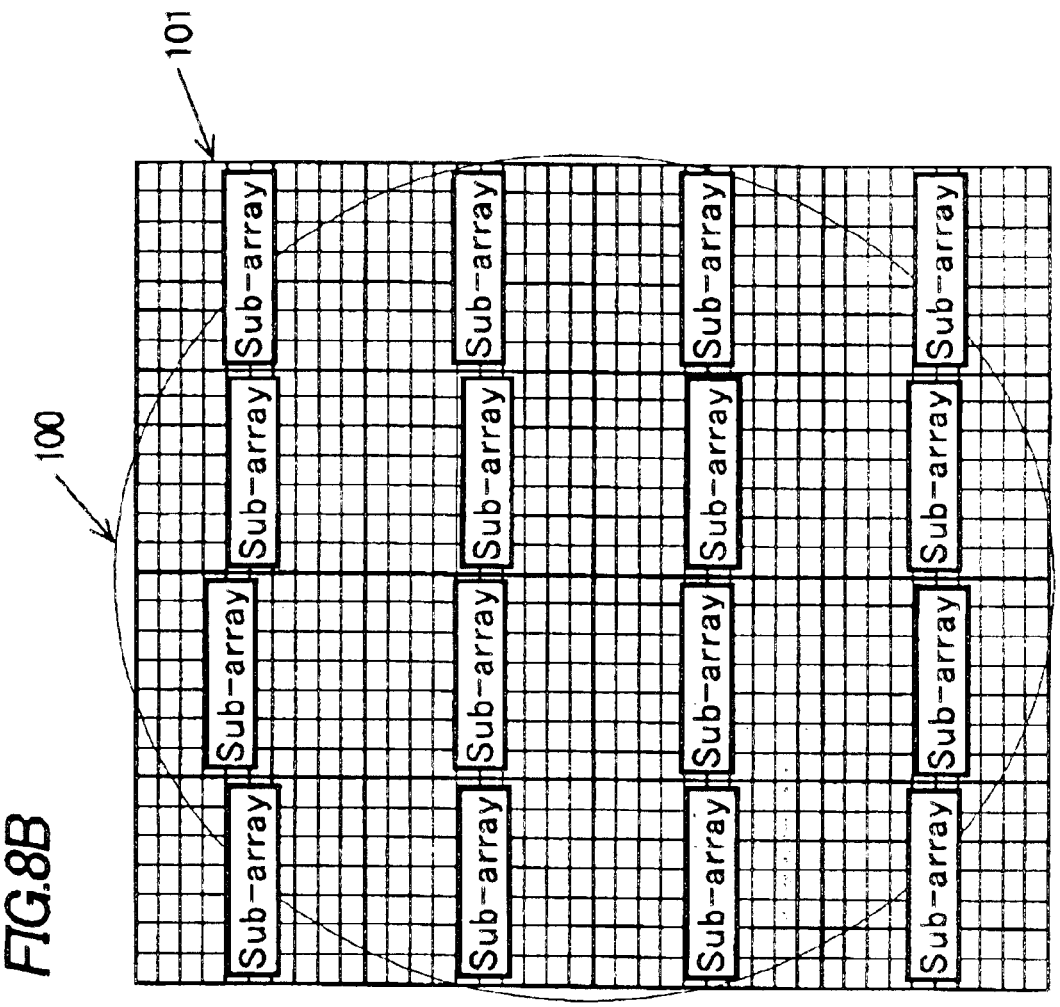
FIGS. 8A and 8B are plan views showing a third example of the lens array.
Figure 8A:
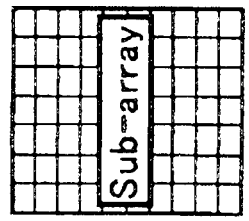

FIG. 8A is a plan view showing a third example of the lens array 101. The third example of the lens array 101 is composed of a single kind of rectangular sub-arrays, as shown in FIG. 8A. Sixteen sub-arrays are bonded to the image sensor wafer 100, as shown in FIG. 8B. Although portions which fall off the image sensor wafer 100 are used in vain, the third example of the lens array 101 has an advantage of manufacturing simplicity, since it is composed of a single kind of sub-arrays.

Figure 9:
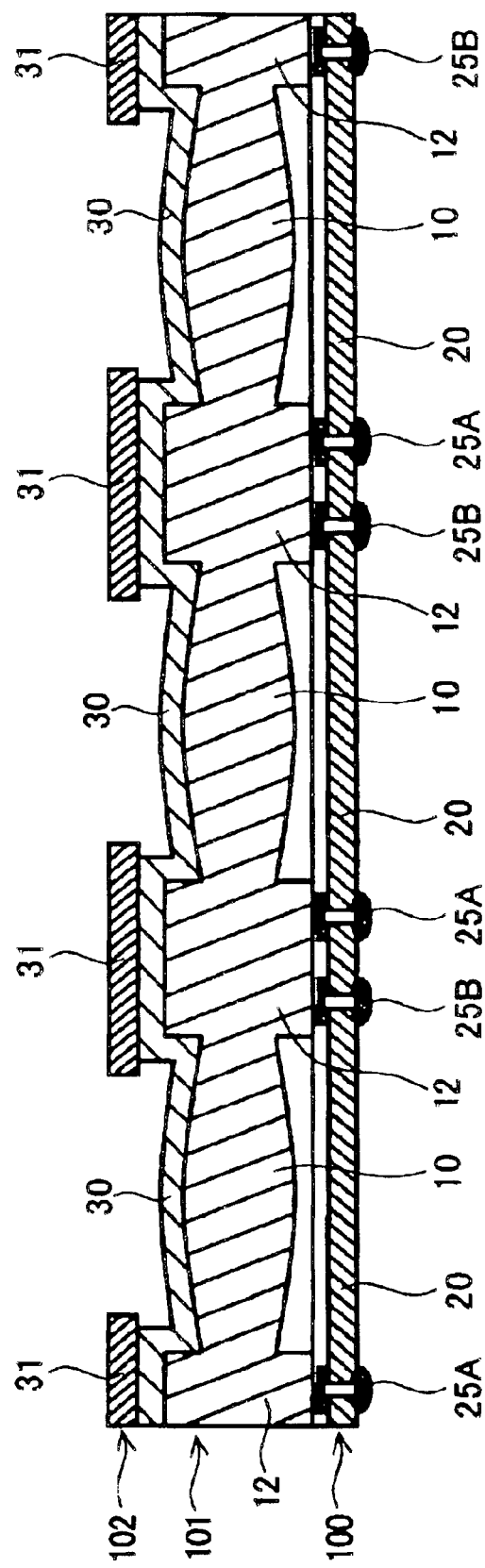
FIG. 9 is a cross-sectional view showing the manufacturing method of the camera module according the embodiments of this invention.

FIG. 9 is a cross-sectional view of the integrated structure formed by bonding the image sensor wafer 100, the lens array 101 and the iris film 102 together. The lens frame 12 of the lens array 101 is disposed across a border between two neighboring image sensor chips 20, in a way that a center line of the lens frame 12 approximately coincides with the border.

Figure 10:
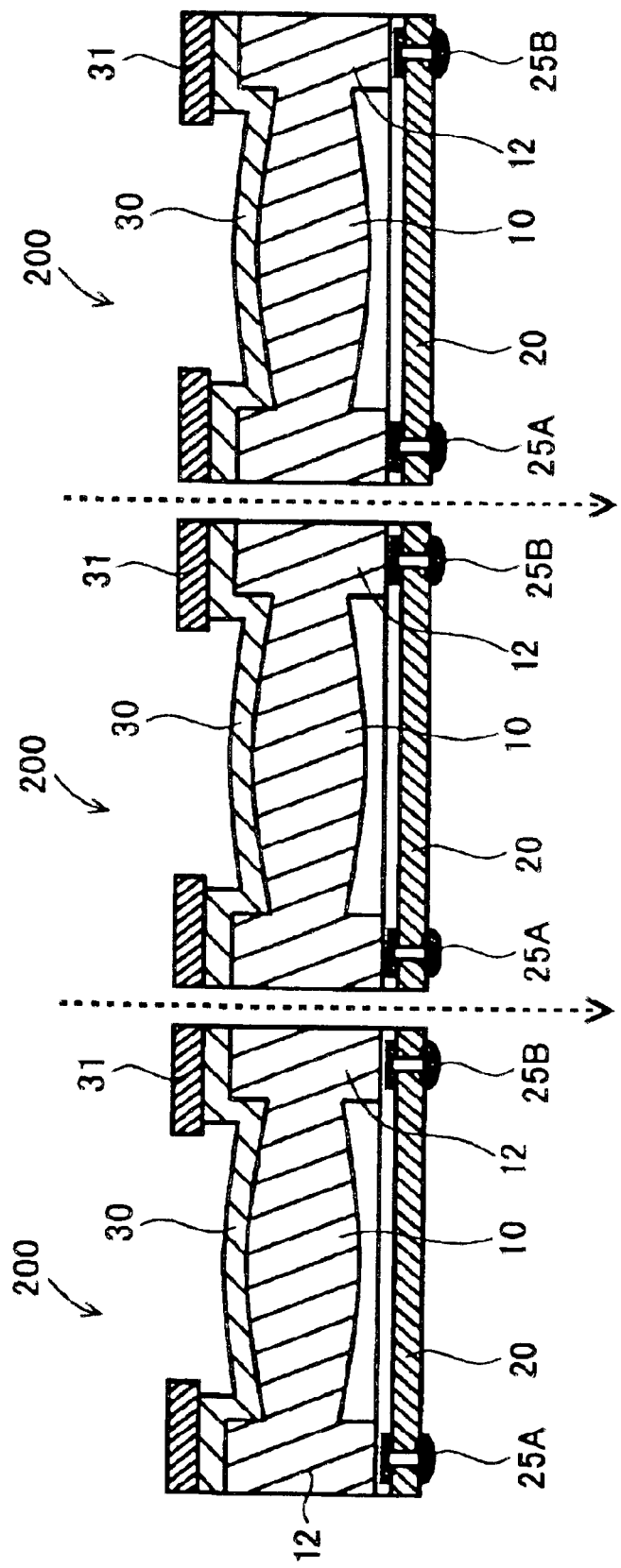
FIG. 10 is a cross-sectional view showing the manufacturing method of the camera module according the embodiments of this invention.
Figure 11:
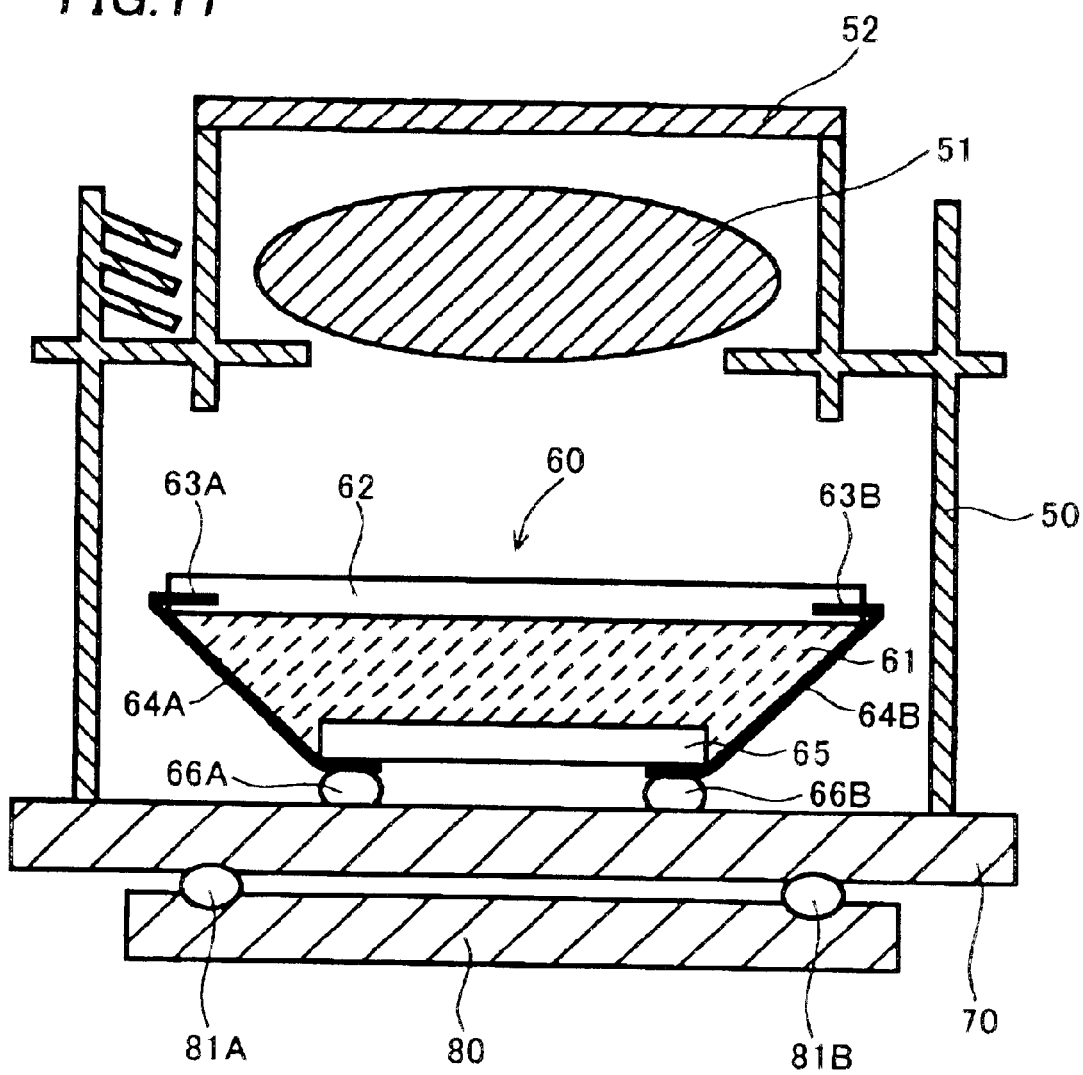
FIG. 11 is a cross-sectional view showing a conventional camera module.

After the bonding process described above, the integrated structure described above is divided into individual camera modules 200 by cutting along borders between the image sensor chips 20 with a dicing blade or a laser, as shown in FIG. 10. The lens frame 12 and the iris material 31 are divided into approximately half in width at the same time.

Then each of the individual camera modules 200 is mounted on a printed circuit board through bump electrodes 25A and 25B on the back surface of the image sensor chip 20.

When the lens 10 is made of plastic, heat resistance of the plastic comes into question, because heat treatment is applied on the bump electrodes 25A and 25B usually when the camera module 200 is mounted on the printed circuit board. In this case, it is better to use a plastic material with a higher heat resistance or gold bumps which can be connected at lower temperature.

The size of the camera module is reduced as well as its manufacturing cost is greatly reduced according to this embodiment, since the camera module is formed by integrating the image sensor chip and the lens into a unit and by providing the filter material composed of a multi-layered thin film to the surface of the lens.

What is claimed is:

1. A camera module comprising:

an image sensor chip comprising a photoelectronic transducer disposed in a top surface thereof and a terminal for external connection disposed on a back surface thereof;

a lens supported on the top surface of the image sensor chip; and a filter formed on a surface of the lens and comprising a plurality of thin films.

2. The camera module of claim 1, wherein one of the thin films comprises a metal film.

3. The camera module of claim 1, wherein the lens comprises a lens body and a lens frame, and the filter is formed only on the lens body.

4. The camera module of claim 3, further comprising an iris material bonded to a surface of the lens frame.

5. A manufacturing method of a camera module comprising:

providing an image sensor wafer comprising a plurality of image sensor chips, each of the image sensor chips comprising a photoelectronic transducer disposed in a top surface thereof and a terminal for external connection disposed on a back surface thereof;

providing a lens array comprising a plurality of lenses;

performing a deposition on a surface of the lens array so as to form a filter comprising a plurality of thin films;

bonding the lens array and the image sensor wafer to form a bonded unit; and dividing the bonded unit into individual camera modules so that each of the camera modules includes one of the image sensor chips and one of the lenses.

6. The manufacturing method of claim 5, wherein the deposition is a vacuum deposition.

7. The manufacturing method of claim 5, wherein the lens array is formed in a horizontal shape substantially the a same as the image sensor wafer.

8. The manufacturing method of claim 5, wherein the lens array comprises a plurality of individual sub arrays of at least two different kinds.

9. The manufacturing method of claim 5, wherein the lens array comprises a plural of rectangular sub arrays.

10. The manufacturing method of claim 5, wherein the deposition is performed so that only portions of the les array corresponding to the lenses are covered by the filter.

* * * * *